US011677403B1

(12) United States Patent
Yang

(10) Patent No.: US 11,677,403 B1
(45) Date of Patent: Jun. 13, 2023

(54) DELAY LOCK LOOP CIRCUIT

(71) Applicant: NANYA TECHNOLOGY CORPORATION, New Taipei (TW)

(72) Inventor: Wu-Der Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/880,669

(22) Filed: Aug. 4, 2022

(51) Int. Cl.
*H03L 7/081* (2006.01)
*H03L 7/085* (2006.01)
*H03K 19/20* (2006.01)
*H03K 19/00* (2006.01)

(52) U.S. Cl.
CPC ............ *H03L 7/0812* (2013.01); *H03L 7/085* (2013.01); *H03K 19/0002* (2013.01); *H03K 19/20* (2013.01)

(58) Field of Classification Search
CPC ... H03L 7/0812; H03L 7/085; H03K 19/0002; H03K 19/20
See application file for complete search history.

(56) References Cited

U.S. PATENT DOCUMENTS

| | | | | |
|---|---|---|---|---|
| 7,020,793 B1* | 3/2006 | Hsieh | ..................... | H03L 7/0812 713/400 |
| 8,085,101 B2* | 12/2011 | Yamamoto | ............ | H03L 7/0898 331/34 |
| 9,331,573 B2* | 5/2016 | Yanagida | ............... | H02M 3/156 |
| 9,419,629 B1* | 8/2016 | Agrawal | ................... | H03K 5/14 |
| 10,454,484 B1* | 10/2019 | Shi | ....................... | G11C 11/4076 |
| 10,474,110 B1* | 11/2019 | Horovitz | .................. | H03L 7/085 |
| 10,979,057 B1* | 4/2021 | Sun | ......................... | H03L 7/091 |
| 11,031,924 B1* | 6/2021 | Cheng | ..................... | H03K 3/038 |
| 11,342,892 B2* | 5/2022 | Akutagawa | ............... | H03F 3/16 |
| 2007/0057708 A1* | 3/2007 | Uehara | .................. | H03L 7/0812 327/156 |
| 2010/0013530 A1* | 1/2010 | Kim | ........................ | H03K 5/133 327/149 |
| 2010/0120389 A1* | 5/2010 | Blum | ..................... | H03L 7/0805 455/208 |
| 2010/0182060 A1* | 7/2010 | Fujino | ................... | H03L 7/0991 327/159 |
| 2014/0266351 A1* | 9/2014 | Na | .......................... | G11C 7/222 327/158 |
| 2015/0372690 A1* | 12/2015 | Tertinek | .................. | H03L 7/085 327/159 |

(Continued)

FOREIGN PATENT DOCUMENTS

KR 101628160 B1 * 6/2016

*Primary Examiner* — Adam D Houston
(74) *Attorney, Agent, or Firm* — JCIPRNET

(57) ABSTRACT

A delay lock loop circuit includes a receiver, a delay line circuit, a clock signal generator and a phase detecting circuit. The receiver receives a clock signal and a reference voltage and generates a reference clock signal according to the clock signal and the reference voltage. The delay line circuit is coupled to the receiver and generates a delayed clock signal by delaying the reference clock signal with a delay indication signal. The clock signal generator generates an output clock signal according to the delayed clock signal. The phase detecting circuit generates a detection result by sampling the reference clock signal with a feedback clock signal generated by the output clock signal, and generates the delay indication signal according to a digital value of the detection result.

17 Claims, 6 Drawing Sheets

100

(56) References Cited

U.S. PATENT DOCUMENTS

| | | | | |
|---|---|---|---|---|
| 2017/0338825 | A1* | 11/2017 | Lee | H03L 7/10 |
| 2020/0228123 | A1* | 7/2020 | Oh | G06F 1/06 |
| 2020/0382107 | A1* | 12/2020 | Zhao | H03K 5/00006 |
| 2021/0250030 | A1* | 8/2021 | Abuellil | H03L 7/0814 |
| 2021/0335403 | A1* | 10/2021 | Choi | G11C 7/1057 |
| 2022/0247390 | A1* | 8/2022 | Kim | H03L 7/0812 |

* cited by examiner

DELAY LOCK LOOP CIRCUIT

BACKGROUND OF THE INVENTION

Technical Field

The present invention generally relates to a delay lock loop circuit, and more particularly to the delay lock loop circuit can avoid latency jump and unlocked event.

Description of Related Art

In conventional art, a delay lock loop circuit detect a phase difference between a reference clock signal and a feedback clock signal by an analogy amplifier. The amplifier always generates phase detection errors caused by a layout mismatch, a component asymmetry and many other reasons. Furthermore, since a sensitivity of the amplifier, a phase detection operation in not stable, and latency jump and unlocked event are happened very often. Such as that, a performance of the delay lock loop circuit is reduced.

SUMMARY OF THE INVENTION

The present invention provides a delay lock loop circuit which can effectively lock a phase of a reference clock signal.

The delay lock loop circuit includes a receiver, a delay line circuit, a clock signal generator and a phase detecting circuit. The receiver receives a clock signal and a reference voltage and generates a reference clock signal according to the clock signal and the reference voltage. The delay line circuit is coupled to the receiver and generates a delayed clock signal by delaying the reference clock signal with a delay indication signal. The clock signal generator is coupled to the delay line circuit and generates an output clock signal according to the delayed clock signal. The phase detecting circuit is coupled to the receiver and the clock signal generator, generates a detection result by sampling the reference clock signal with a feedback clock signal generated by the output clock signal, and generates the delay indication signal according to a digital value of the detection result.

In summary, the delay lock loop circuit presented of presented disclosure provides the phase detecting circuit to sample the reference clock signal with the feedback clock signal to obtain the detection result. The phase detecting circuit further generates the delay indication signal according to the digital value of the detection result and the delay indication signal may be used to indicate a lock state of the delay lock loop circuit. Such as that, a delay amount of the delay line circuit may be adjusted effectively according to the delay indication signal, the delay lock loop circuit can be well locked, and latency jump can be avoid.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
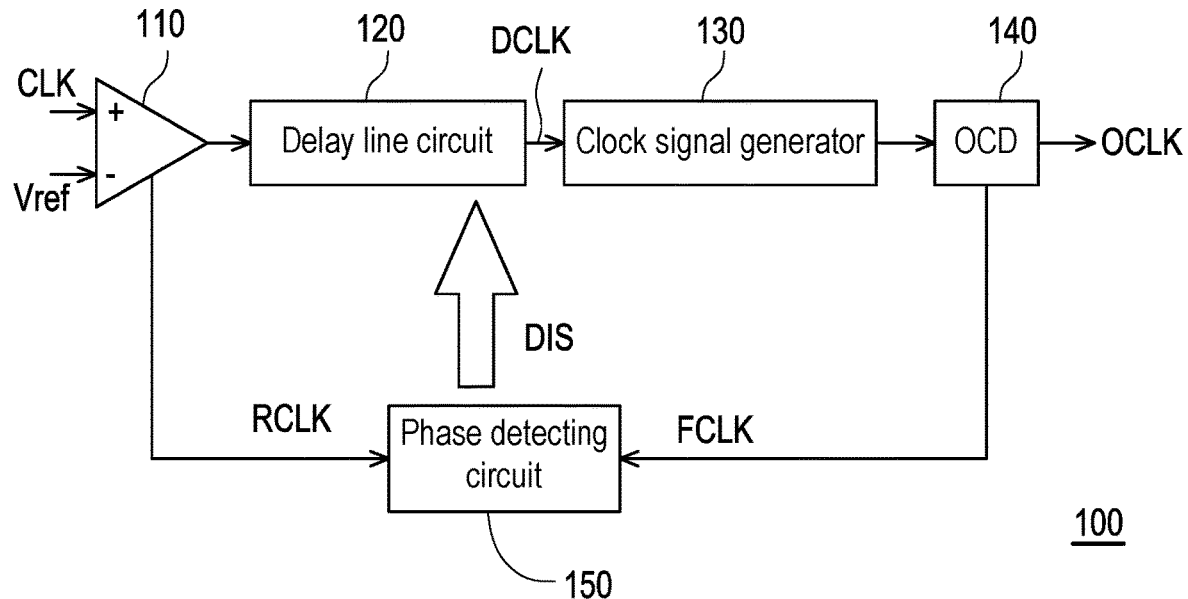
FIG. 1 illustrates a schematic diagram of a delay lock loop circuit according to an embodiment of present disclosure.

Reference will now be made in detail to the present preferred embodiment of the invention, examples of which are illustrated in the accompanying drawings. Wherever possible, the same reference numbers are used in the drawings and the description to refer to the same or like parts.

Please refer to FIG. 1, which illustrates a schematic diagram of a delay lock loop circuit according to an embodiment of present disclosure. The delay lock loop circuit 100 includes a receiver 110, a delay line circuit 120, a clock signal generator 130 and a phase detecting circuit 140. The receiver 110 receives a clock signal CLK and a reference voltage Vref and generates a reference clock signal RCLK according to the clock signal CLK and the reference voltage Vref. In this embodiment, the receiver 110 may be an amplifier having a positive input end and a negative input end. The positive input end of the receiver 110 receives the clock signal CLK, and the negative input end of the receiver 110 receives the reference voltage Vref. The receiver 110 generates the reference clock signal RCLK by comparing the clock signal CLK with the reference voltage Vref. The receiver 110 further provides the reference clock signal RCLK to the delay line circuit 120 and the phase detecting circuit 150.

The delay line circuit 120 is coupled to the receiver 110. The delay line circuit 120 receives the reference clock signal RCLK from the receiver 110, and generates a delayed clock signal DCLK by delaying the reference clock signal RCLK according to a delay indication signal DIS. The delay indication signal DIS may be provided by the phase detecting circuit 150, and the delay line circuit 120 may determine a provided delay amount for delaying the reference clock signal RCLK to generate the delayed clock signal DCLK.

The clock signal generator 130 is coupled to the delay line circuit 120. The clock signal generator 130 receives the delayed clock signal DCLK and generates an output clock signal OCLK based on the delayed clock signal DCLK. The clock signal generator 130 may provide the output clock signal OCLK to an off-chip driver (OCD) 140. The OCD 140 may be configured to drive an output buffer for outputting data, and the OCD 140 may generate a feedback clock signal FCLK according to the output clock signal OCLK.

The phase detecting circuit 150 is coupled between the receiver 110 and the ODC 140. The phase detecting circuit 150 receives the reference clock signal RCLK form the receiver 110, and receives the feedback clock signal FCLK from the OCD 140. The phase detecting circuit 150 generates a detection result by sampling the reference clock signal RCLK with the feedback clock signal FCLK, and generates the delay indication signal DIS according to a digital value of the detection result.

In detail, the phase detecting circuit 150 may be a logic circuit. The phase detecting circuit 150 may sample the reference clock signal RCLK with the feedback clock signal FCLK during a plurality of consecutive sample time points, and records the sample results to generate the detection result. The phase detecting circuit 150 may sample the reference clock signal RCLK by positive edges or negative edges of the feedback clock signal FCLK.

Figure 2:
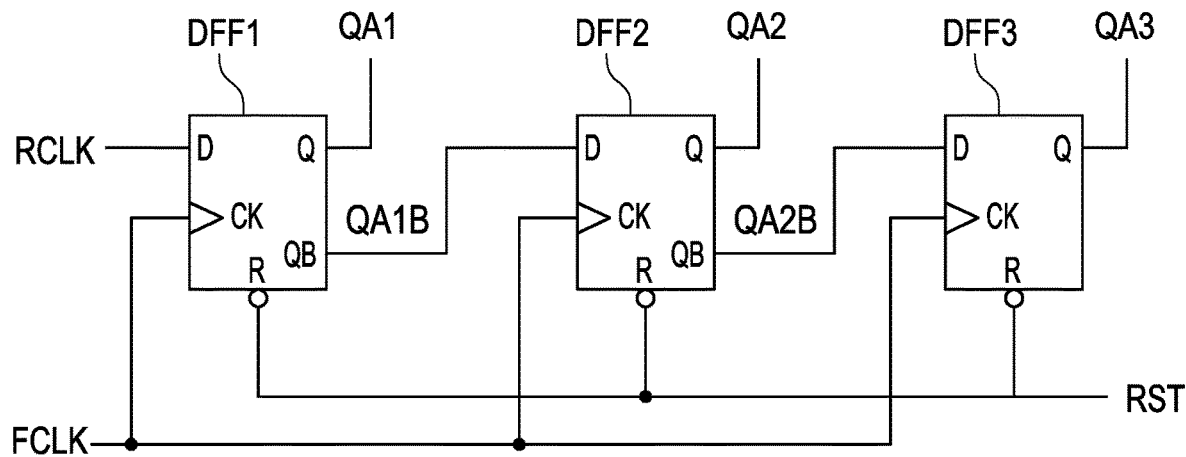
FIG. 2 illustrates a circuit diagram of a phase detecting circuit of the delay lock loop circuit according to the embodiment of FIG. 1.

Please refer to FIG. 2, which illustrates a circuit diagram of a phase detecting circuit of the delay lock loop circuit according to the embodiment of FIG. 1. In FIG. 2, the phase detecting circuit 150 includes a plurality of flip-flops DFF1~DFF3. The flip-flops DFF1~DFF3 are coupled in series. The flip-flop DFF1 (a first flip-flop) has a data end D for receiving the reference clock signal RCLK; a clock end CK for receiving the feedback clock signal FCLK; and an output end Q for generating a first bit QA1 of the detection result. The flip-flop DFF2 (a second flip-flop) has a data end D coupled to an inverted output end QB of the flip-flop DFF1; a clock end CK for receiving the feedback clock signal FCLK; and an output end Q for generating a second bit QA2 of the detection result. The flip-flop DFF3 (a third flip-flop) has a data end D coupled to an inverted output end of the flip-flop DFF2; a clock end CK for receiving the feedback clock signal FCLK; and an output end Q for generating a third bit QA3 of the detection result.

Each of the flip-flops DFF1-DFF3 has a reset end R for receiving a reset signal RST. In this embodiment, the flip-flops DFF1-DFF3 can be reset when the reset signal RST is at logic low. When the flip-flops DFF1-DFF3 are reset, the first bit to the third bit QA1-QA3 of the detection result are at logic low.

The flip-flop DFF1 is used to sample the reference clock signal RCLK by positive edges of the feedback clock signal FCLK. If the first bit QA1 of the detection result is generated according to a first positive edge of the reference clock signal RCLK, a bit QA1B inverted to the first bit QA1 can be shifted to and stored in the flip-flop DFF2 at a second positive edge of the reference clock signal RCLK. At this time, the second bit QA2 equals to the bit QA1B. Furthermore, at a third positive edge of the reference clock signal RCLK, a bit QA2B inverted to the second bit QA2 of the detection result may be shifted and stored in the flip-flop DFF3, and the third bit QA3 of the detection result may be generated. That is, the flip-flops DFF2 and DFF3 are configured to form a shift register circuit, and the shift register circuit can record sample results generated by the flip-flop FF1 with consecutive positive edges of the feedback clock signal FCLK.

It should be noted here, the bit QA1 may be a least significant bit (LSB) of the digital value, and the bit QA3 may be a most significant bit (MSB) of the digital value.

Figure 3A:
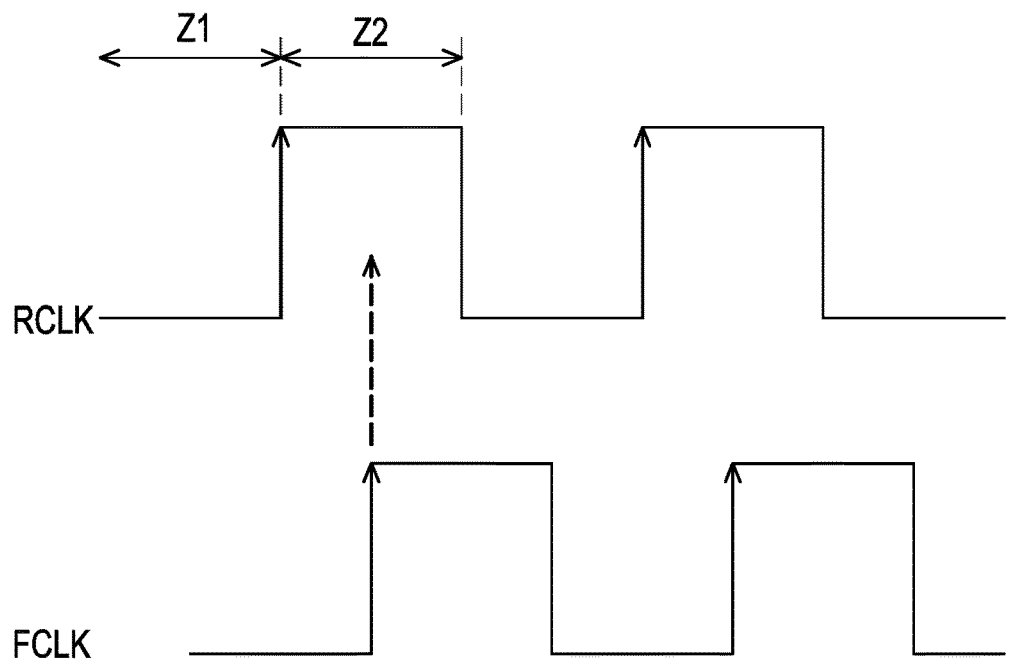
FIG. 3A and FIG. 3B illustrate waveform plots of the phase detecting circuit according to an embodiment of present disclosure.
Figure 3B:
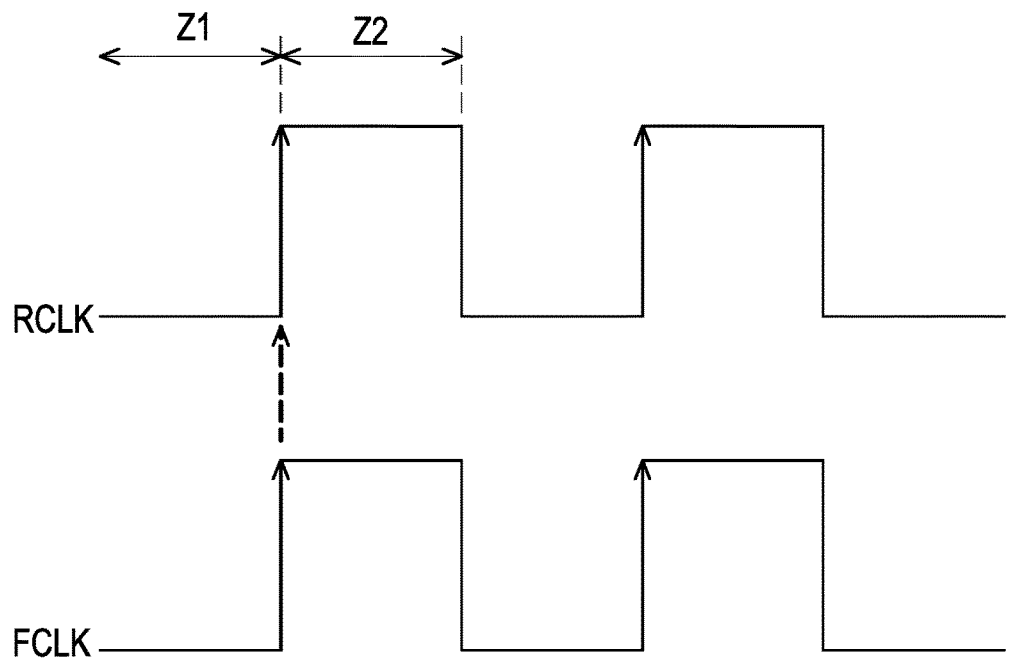

Please refer to FIG. 2, FIG. 3A and FIG. 3B commonly, wherein FIG. 3A and FIG. 3B illustrate waveform plots of the phase detecting circuit according to an embodiment of present disclosure. Initially, all of the flip-flops DFF1-DFF3 are reset according to the reset signal RST. All of the bits QA1-QA3 of the detection signal are at logic low. Then, refer to FIG. 3A, if a phase of the feedback clock signal FCLK is lag to the reference clock signal RCLK, and a first positive edge of the feedback clock signal FCLK fall in a positive pulse (a zone Z2), at a sample time point T0 corresponding to the first positive edge of the feedback clock signal FCLK, all of the bits QA1-QA3 of the detection signal are at logic high. At this time, a digital value of the detection signal is 7 in decimal.

At a sample time point T1 next to the sample time point T0, if a second positive edge corresponding to the sample time point T1 still falls in the zone Z2, the bits QA1-QA3 of the detection signal may be at logic high, low, low, respectively, and the digital value of the detection signal is 1 in decimal. At a sample time point T2 next to the sample time point T1, if a third positive edge corresponding to the sample time point T2 still falls in the zone Z2, the bits QA1-QA3 of the detection signal may be at logic high, low, high, respectively, and the digital value of the detection signal is 5 in decimal. Furthermore, from consecutive sample time points T3 to T7 next to the sample time point T2, if the positive edges corresponding to the sample time points T3 to T7 still fall in the zone Z2, the bits QA1-QA3 of the detection signal may be at logic high, low, high, respectively, and the digital value of the detection signal is kept on 5 in decimal.

In here, the phase detecting circuit 150 can detect that a number of consecutive times that the digital value equals to a first number (=5) equals to 6, and the phase detecting circuit 150 can compare the number of consecutive times with a first threshold value, and the first threshold value may be 5 in this embodiment. If the number of consecutive times is larger than the first threshold, the phase detecting circuit 150 can generate the delay indication signal DIS to decrease a delay amount of the delay line circuit.

In this embodiment, a number of the flip-flops of the phase detecting circuit 150 can be adjusted by a designer according to physical necessary, and is not limited to 3. Also, the first threshold value can be set by the designer and is not limited to 5, either.

After the delay amount of the delay line circuit has been decreased, refer to FIG. 3B, and a positive edge of the feedback clock signal FCLK may fall in a zone Z1 corresponding to logic low of the reference clock signal RCLK. At this time, the logic low of the reference clock signal RCLK can be sampled by the positive edge of the feedback clock signal FCLK, and the bits QA1-QA3 of the detection signal may be at logic low, low, high, respectively, and the digital value of the detection signal is kept on 4 in decimal at a sample time point T8. Since the bits QA1 of the detection signal is at logic low, the phase detecting circuit 150 may adjust the delay indication signal DIS to increase the delay amount of the delay line circuit. Then, at a sample time point T9 next to the sample time point T8, a corresponding positive edge of the feedback clock signal FCLK may fall in the zone Z2, and all of the bits QA1-QA3 of the detection signal may be at logic high, the digital value of the detection signal is 7 in decimal at a sample time point T9.

At consecutive sample time points T10 to T15, corresponding positive edges may wander between the zone Z1 and Z2, and the digital value of the detection signal may be alternatively changed between a third number (=0) and a fourth number (=7) consecutively. If the phase detecting circuit 150 detects the digital value of the detection signal is alternatively changed between the third number and the fourth number, the phase detecting circuit 150 can generate the delay indication signal HIS to indicate the delay lock loop circuit is in a locked status.

A truth table of this embodiment can be seen as below, where 0 is logic low and 1 is logic high in this table:

| | Q1A | Q1B | Q1C | Digital value |
|---|---|---|---|---|
| Reset | 0 | 0 | 0 | 0 |
| T0 | 1 | 1 | 1 | 7 |
| T1 | 1 | 0 | 1 | 5 |
| T2 | 1 | 0 | 1 | 5 |
| T3 | 1 | 0 | 1 | 5 |
| T4 | 1 | 0 | 1 | 5 |
| T5 | 1 | 0 | 1 | 5 |
| T6 | 1 | 0 | 1 | 5 |
| T7 | 1 | 0 | 0 | 4 |
| T8 | 1 | 1 | 1 | 7 |
| T9 | 0 | 0 | 0 | 0 |
| T10 | 1 | 1 | 1 | 7 |
| T11 | 0 | 0 | 0 | 0 |
| T12 | 1 | 1 | 1 | 7 |
| T13 | 0 | 0 | 0 | 0 |
| T14 | 1 | 1 | 1 | 7 |
| T15 | 0 | 0 | 0 | 0 |

Figure 4A:
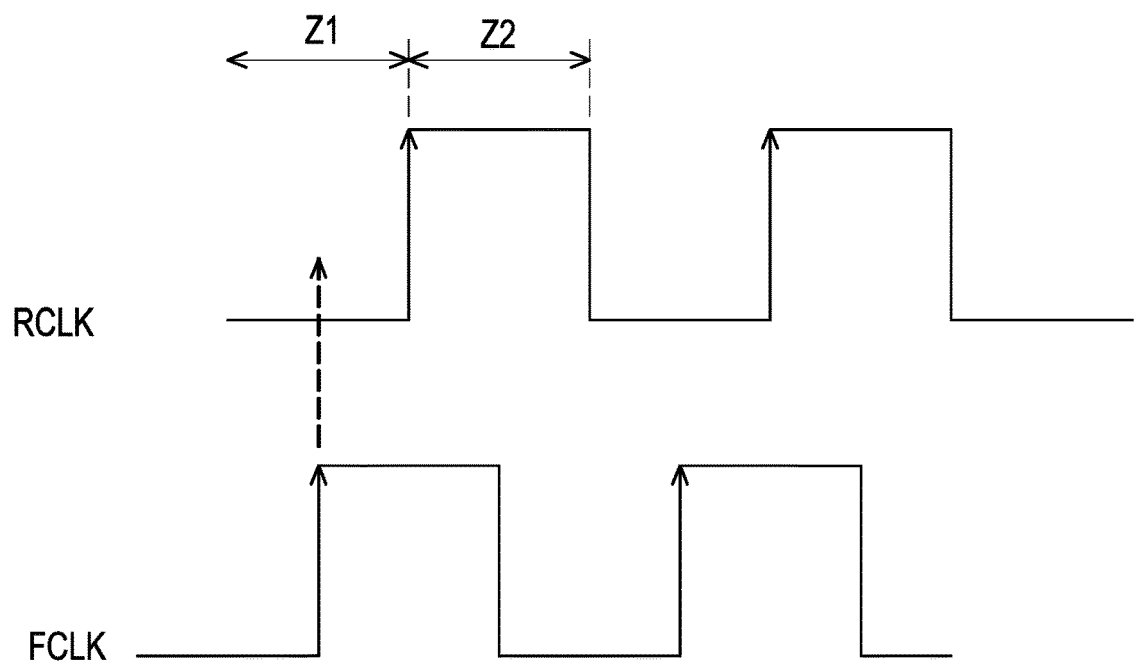
FIG. 4A and FIG. 4B illustrate waveform plots of the phase detecting circuit according to another embodiment of present disclosure.
Figure 4B:
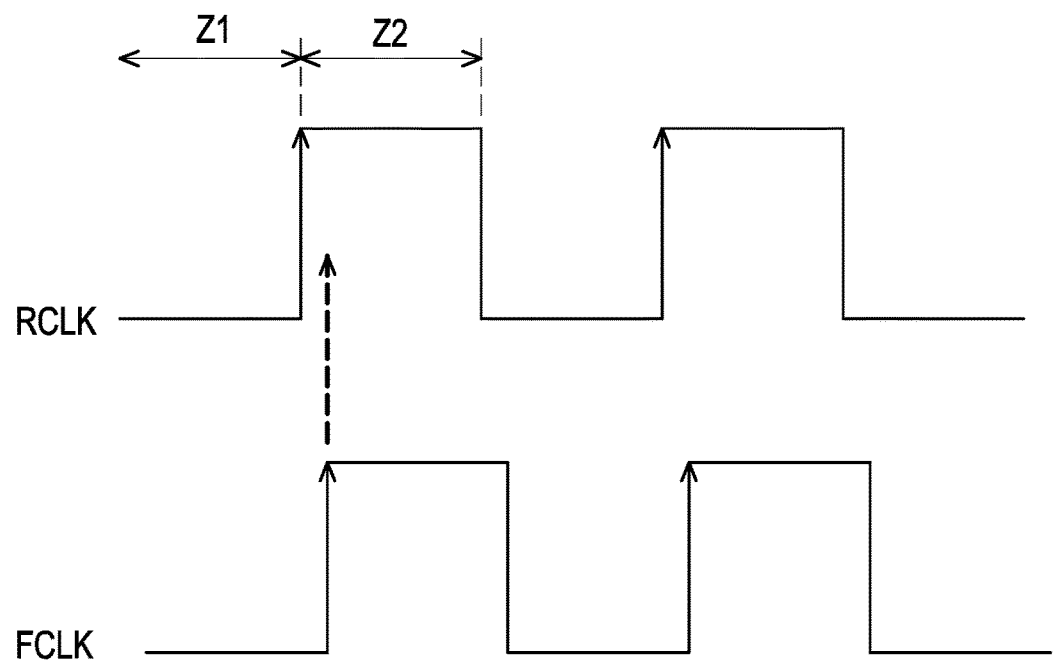

Please refer to FIG. 2, FIG. 4A and FIG. 4B commonly, wherein FIG. 4A and FIG. 4B illustrate waveform plots of the phase detecting circuit according to another embodiment of present disclosure. Initially, all of the flip-flops FF1-FF3 are reset according to the reset signal RST. All of the bits QA1-QA3 of the detection signal are at logic low. Then, refer to FIG. 4A, if a phase of the feedback clock signal FCLK is lead to the reference clock signal RCLK, and a first positive edge of the feedback clock signal FCLK fall in a zone Z1 corresponding to logic 0 of the reference clock signal RCLK, at a sample time point T0 corresponding to the first positive edge of the feedback clock signal FCLK, the bits QA1-QA3 of the detection signal may be at logic low, high, high, respectively. At this time, a digital value of the detection signal is 6 in decimal.

At a sample time point T1 next to the sample time point T0, if a second positive edge corresponding to the sample time point T1 still falls in the zone Z1, the bits QA1-QA3 of the detection signal may be at logic low, high, low, respectively, and the digital value of the detection signal is 2 in decimal. Furthermore, from consecutive sample time points T2 to T6 next to the sample time point T1, if the positive edges corresponding to the sample time points T2 to T6 still fall in the zone Z1, the bits QA1-QA3 of the detection signal may be at logic low, high, low, respectively, and the digital value of the detection signal is kept on 2 in decimal.

In here, the phase detecting circuit 150 can detect that a number of consecutive times that the digital value equals to a first number (=2) equals to 6, and the phase detecting circuit 150 can compare the number of consecutive times with a second threshold value, and the second threshold value may be 5 in this embodiment. If the number of consecutive times is larger than the second threshold, the phase detecting circuit 150 can generate the delay indication signal DIS to increase a delay amount of the delay line circuit.

In this embodiment, the second threshold value can be set by the designer and is not limited to 5. Furthermore, the second threshold and the first threshold value may be same or different.

After the delay amount of the delay line circuit has been increased, refer to FIG. 4B, and a positive edge of the feedback clock signal FCLK may fall in a zone Z2 corresponding to logic high of the reference clock signal RCLK. At this time, the logic high of the reference clock signal RCLK can be sampled by the positive edge of the feedback clock signal FCLK, and the bits QA1-QA3 of the detection signal may be at logic high, high, low, respectively, and the digital value of the detection signal is kept on 3 in decimal at a sample time point T7. Since the bits QA1 of the detection signal is at logic high, the phase detecting circuit 150 may adjust the delay indication signal DIS to decrease the delay amount of the delay line circuit. Then, at a sample time point T8 next to the sample time point T7, a corresponding positive edge of the feedback clock signal FCLK may fall in the zone Z1, and all of the bits QA1-QA3 of the detection signal may be at logic low, the digital value of the detection signal is 0 in decimal at a sample time point T8.

At consecutive sample time points T9 to T15, corresponding positive edges may wander between the zone Z2 and Z1, and the digital value of the detection signal may be alternatively changed between the fourth number (=7) and the third number (=0) consecutively. If the phase detecting circuit 150 detects the digital value of the detection signal is alternatively changed between the third number and the fourth number, the phase detecting circuit 150 can generate the delay indication signal HIS to indicate the delay lock loop circuit is in a locked status.

A truth table of this embodiment can be seen as below, where 0 is logic low and 1 is logic high in this table:

| | Q1A | Q1B | Q1C | Digital value |
|---|---|---|---|---|
| Reset | 0 | 0 | 0 | 0 |
| T0 | 0 | 1 | 1 | 6 |
| T1 | 0 | 1 | 0 | 2 |
| T2 | 0 | 1 | 0 | 2 |
| T3 | 0 | 1 | 0 | 2 |
| T4 | 0 | 1 | 0 | 2 |
| T5 | 0 | 1 | 0 | 2 |
| T6 | 0 | 1 | 0 | 2 |
| T7 | 1 | 1 | 0 | 3 |
| T8 | 0 | 0 | 0 | 0 |
| T9 | 1 | 1 | 1 | 7 |
| T10 | 0 | 0 | 0 | 0 |
| T11 | 1 | 1 | 1 | 7 |
| T12 | 0 | 0 | 0 | 0 |
| T13 | 1 | 1 | 1 | 7 |
| T14 | 0 | 0 | 0 | 0 |
| T15 | 1 | 1 | 1 | 7 |

Figure 5:
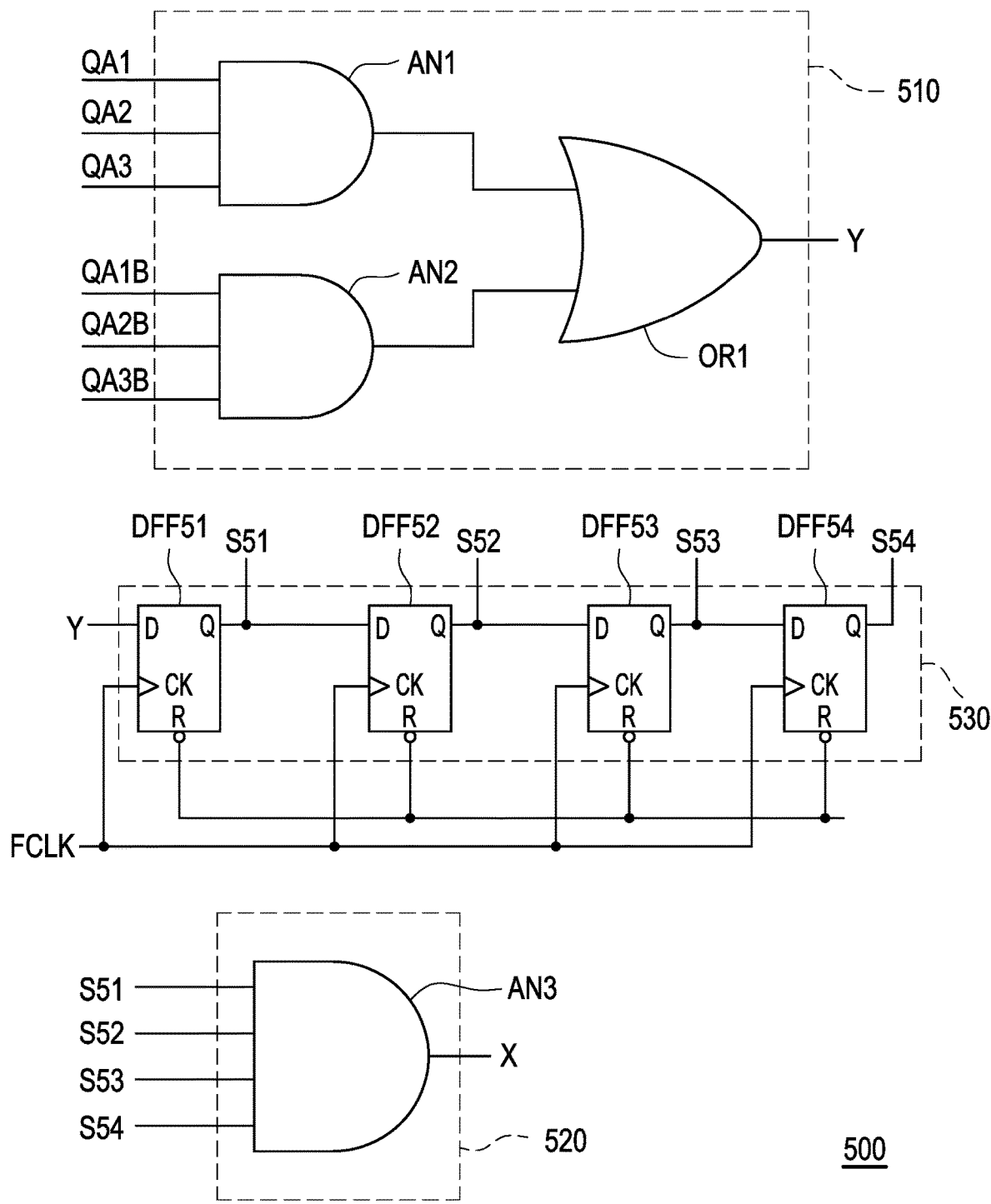
FIG. 5 illustrates a circuit diagram of a phase detecting circuit of the delay lock loop circuit according to another embodiment of present disclosure.

Please refer to FIG. 5, which illustrates a circuit diagram of a phase detecting circuit of the delay lock loop circuit according to another embodiment of present disclosure. Except for the flip-flops DFF1-DFF3 in FIG. 2, the phase detecting circuit 500 further includes logic circuits 510, 520 and a shift register circuit 530. The logic circuit 510 performs logic operation on the digital value and generates a signal Y if the digital value equals to the third number (=0) or the fourth number (=7). The shift register circuit 530 is coupled to the logic circuit 510, and is configured to shift the signal Y according to the feedback clock signal FCLK to generate a plurality of shifting bits S51-S54. The logic circuit 520 is coupled to the shift register circuit 530 and performs logic operation on the shifting bits S51-S54 to generate a locked flag X, wherein the locked flag X is used to indicate the delay lock loop circuit is in the locked status.

In detail, the logic circuit 510 includes AND gates AN1, AN2 and an OR gate OR1. The AND gate AN1 receives the bits QA1-QA3 of the detection result, and the AND gate AN2 receives the bits QA1B-QA3B which are respectively inverted to the bits QA1-QA3. Two input ends of the OR gate OR1 are respectively coupled to output ends of the AND gates AN1 and AN2, and the OR gate OR1 is used to generate the signal Y.

About operation of the logic circuit 510, if the digital value of the detection result is 7 or 0 in decimal, one of the AND gates AN1 and AN2 can provide logic high to one input end of the OR gate OR1. Such as that, the OR gate OR1 can generate the signal Y at logic 1.

The shift register circuit 530 includes a plurality of flip-flops DFF51-DFF54 which are coupled in series. The shift register circuit 530 receives the signal Y by the flip-flop DFF51, and the flip-flops DFF51-DFF54 generate the shifting bits S51-S54 by shifting the signal Y according to positive edges of the feedback clock signal FCLK. If the signal Y is kept on logic high for 4 or higher clock cycles of the feedback clock signal FCLK, all of the shifting bits S51-S54 may be at logic high at same time.

The logic circuit 520 includes an AND gate AN3. The AND gate AN3 receives the shifting bits S51-S54 and generates the locked flag X. If all of the shifting bits S51-S54 are at logic high, logic circuit 520 can generate the locked flag X at logic high to indicate the delay lock loop circuit is at a locked status.

Please be noted here, a number of flip-flops of the shift register circuit 530 can be determined by a designer of the delay lock loop circuit and is not limited to 4 as shown in FIG. 5. By using more flip-flops in the shift register circuit 530, the locked status of the delay lock loop circuit can be determined with higher accuracy. Of course, a number of the input ends of the AND gate AN3 can be adjusted according to the number of the flip-flops in the shift register circuit 530.

Figure 6:
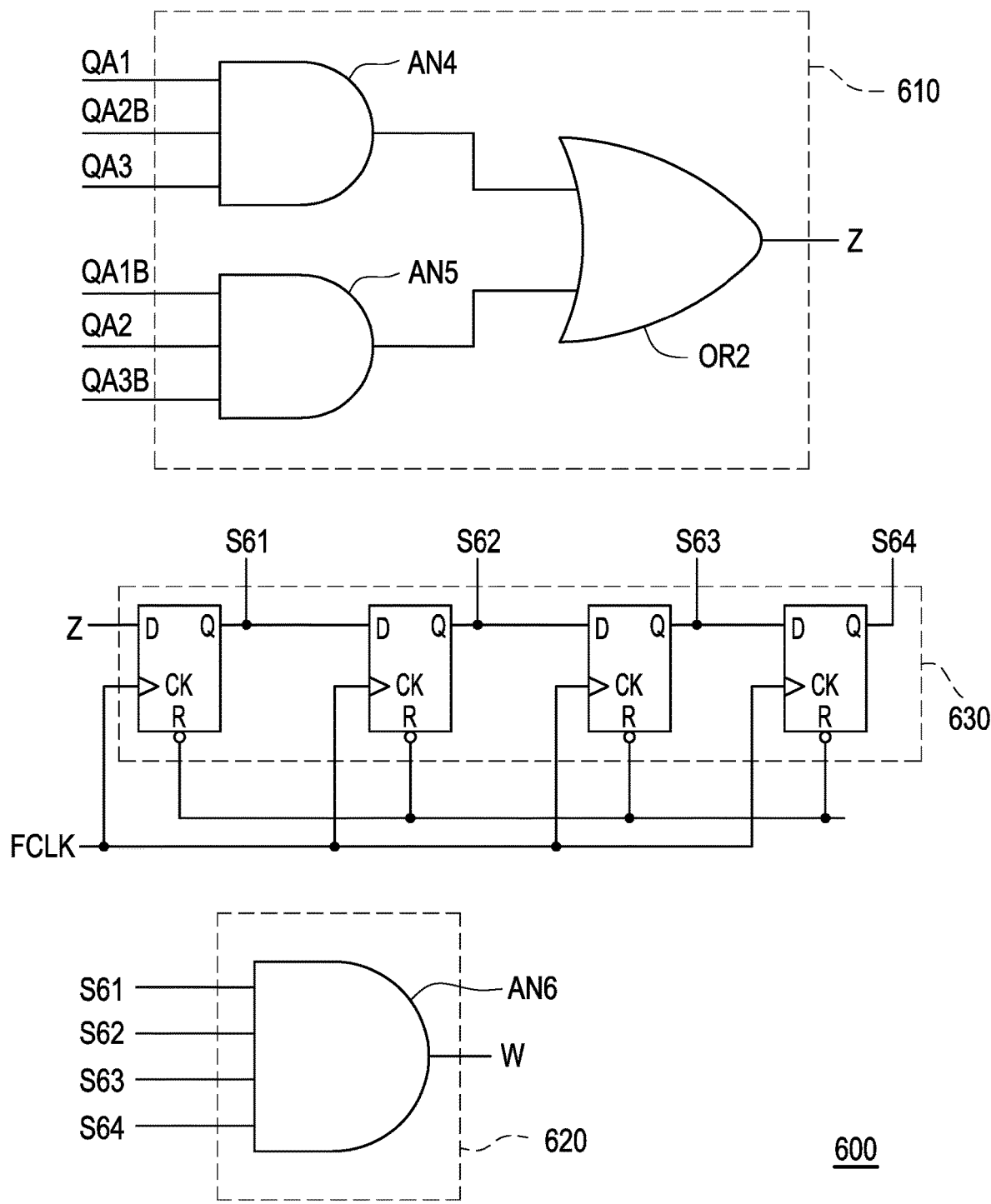
FIG. 6 illustrates a circuit diagram of a phase detecting circuit of the delay lock loop circuit according to another embodiment of present disclosure.

Please refer to FIG. 6, which illustrates a circuit diagram of a phase detecting circuit of the delay lock loop circuit according to another embodiment of present disclosure. Except for the components in FIG. 2 and FIG. 5, the phase detecting circuit 600 further includes logic circuits 610, 620 and a shift register circuit 630. The logic circuit 610 performs logic operation on the digital value and generates a signal Z if the digital value equals to the first number (=5) or the second number (=2). The shift register circuit 630 is coupled to the logic circuit 610, and is configured to shift the signal Z according to the feedback clock signal FCLK to generate a plurality of shifting bits S61-S64. The logic circuit 620 is coupled to the shift register circuit 630 and performs logic operation on the shifting bits S61-S64 to generate a far-away-locked flag W, wherein the far-away-locked flag W is used to indicate the delay lock loop circuit is far away from the locked status.

In detail, the logic circuit 610 includes AND gates AN4, AN5 and an OR gate OR2.

The AND gate AN4 receives the bits QA1, QA2B and QA3 of the detection result, and the AND gate AN5 receives the bits QA1B, QA2 and QA3B of the detection result. Two input ends of the OR gate OR1 are respectively coupled to output ends of the AND gates AN4 and AN5, and the OR gate OR1 is used to generate the signal Z.

About operation of the logic circuit 610, if the digital value of the detection result is 5 or 2 in decimal, one of the AND gates AN4 and AN5 can provide logic high to one input end of the OR gate OR2. Such as that, the OR gate OR2 can generate the signal Z at logic 1.

The shift register circuit 630 includes a plurality of flip-flops DFF61-DFF64 which are coupled in series. The shift register circuit 630 receives the signal Z by the flip-flop DFF61, and the flip-flops DFF61-DFF64 generate the shifting bits S61-S64 by shifting the signal Z according to positive edges of the feedback clock signal FCLK. If the signal Z is kept on logic high for 4 or higher clock cycles of the feedback clock signal FCLK, all of the shifting bits S61-S64 may be at logic high at same time.

The logic circuit 620 includes an AND gate AN6. The AND gate AN6 receives the shifting bits S61-S64 and generates the far-away-locked flag W. If all of the shifting bits S61-S64 are at logic high, logic circuit 620 can generate the far-away-locked flag W at logic high to indicate the delay lock loop circuit is far away from the locked status.

Please be noted here, a number of flip-flops of the shift register circuit 630 can be determined by a designer of the delay lock loop circuit and is not limited to 4 as shown in FIG. 6. By using more flip-flops in the shift register circuit 630, the locked status of the delay lock loop circuit can be determined with higher accuracy. Of course, a number of the input ends of the AND gate AN6 can be adjusted according to the number of the flip-flops in the shift register circuit 630.

Figure 7:
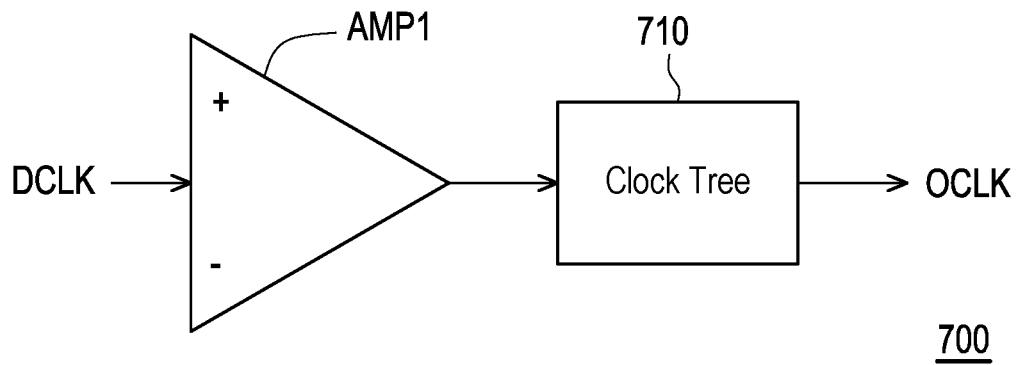
FIG. 7 illustrates a schematic diagram of a clock signal generator according to an embodiment of present disclosure.

Please refer to FIG. 7, which illustrates a schematic diagram of a clock signal generator according to an embodiment of present disclosure. The clock signal generator 130 in FIG. 1 can be implemented by the clock signal generator 700. The clock signal generator 700 includes an amplifier AMP1 and a clock tree 710. The amplifier AMP1 receives a delayed clock signal DCLK from a delay line circuit (such as the delay line circuit 120 in FIG. 1). An output end of the amplifier AMP1 is coupled to the clock tree 710. The clock tree 710 may generate an output clock signal OCLK based on an output signal of the amplifier AMP1.

The amplifier AMP1 may be implemented by any amplifying circuit well known by a person skilled in the art, the clock tree 710 also may be implemented by any clock tree circuit well known by the person skilled in the art, and no more special limitation here.

Figure 8:
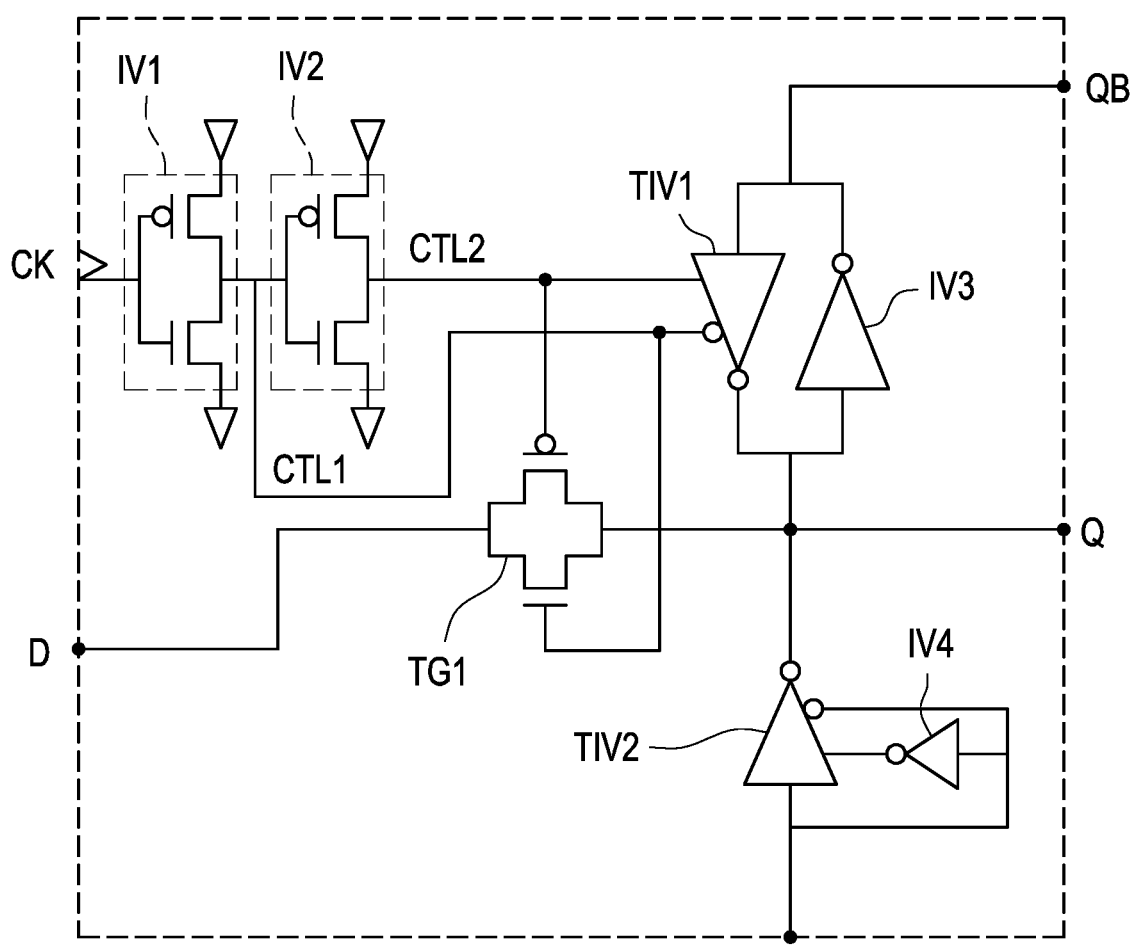
FIG. 8 illustrates a schematic diagram of a flip-flop according to an embodiment of present disclosure.

Please refer to FIG. 8, which illustrates a schematic diagram of a flip-flop according to an embodiment of present disclosure. Please be noted here, by referring to FIG. 2, each of the flip-flops DFF1-DFF3 may be a D-type flip-flop with high operation speed, and each of the flip-flops DFF1-DFF3 may be implemented by the flip-flop 800 in FIG. 8. The flip-flop 800 has a clock end CK, a data end D, an output end Q, an inverted output end QB and a reset end R. The flip-flop 800 includes inverters IV1 to IV4, a transmission gate TG1 and tri-state inverters TIV1 and TIV2. An input end of the inverter IV1 is coupled to the clock end CK, and the inverters IV1 and IV2 are coupled in series. The inverters IV1 and IV2 respectively generate control signals CTL1 and CTL2. The transmission gate TG1 is coupled between the data end D and the output end Q. The transmission gate TG1 are controlled by the control signals CTL1 and CTL2 to be turned-on or cut-off. An input end of the tri-state inverter TIV1 is coupled to the inverted output end QB, an output end of the tri-state inverter TIV1 is coupled to the output end Q. An input end of the tri-state inverter TIV2 is coupled to the reset end R, an output end of the tri-state inverter TIV2 is coupled to the output end Q. An input end of the inverter IV3 is coupled to the output end Q, and an output end of the inverter IV3 is coupled to the inverted output end QB.

The tri-state inverter TIV1 is controlled by the control signal CTL1 and CTL2. The tri-state inverter TIV2 is controlled by a signal on the reset end R, and a signal RB generated by the inverter IV4, wherein the signal RB is inverted to the signal on the reset end R.

If the transmission gate TG1 is turned-on, a signal on the data end D can be passed to the output end Q. At this time, the tri-state inverter TIV1 is cut-off, and the inverter IV3 generates a signal on the inverted output end QB by inverting the signal on the data end D. If the transmission gate TG1 is cut-off, the tri-state inverter TIV1 is turned-on correspondingly, and the tri-state inverter TIV1 and the inverter IV3 can form a latch for latching the signal on the output end Q.

On the other hand, the tri-state inverter TIV2 can be turned-on when a reset signal on the reset end R is at logic low. At this time, the signal on the output end Q can be pulled to logic high.

A hardware structure of the tri-state inverters TIV1 and TIV2 can be implemented by any tri-state inverter well known by a person skilled in the art, and no special limitation here.

In summary, the delay lock loop circuit of present disclosure provides a phase detecting circuit to identify a lock status of the delay lock loop circuit by sampling a reference clock signal with a feedback clock signal. The phase detecting circuit further generate a delay indication signal according to a digital value of the detection result, and a phase lock operation can be operated effectively.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A delay lock loop circuit, comprising:
   a receiver, receiving a clock signal and a reference voltage and generating a reference clock signal according to the clock signal and the reference voltage;
   a delay line circuit, coupled to the receiver and generating a delayed clock signal by delaying the reference clock signal according to a delay indication signal;
   a clock signal generator, coupled to the delay line circuit, generating an output clock signal according to the delayed clock signal; and
   a phase detecting circuit, coupled to the receiver and the clock signal generator, generating a detection result by sampling the reference clock signal with a feedback clock signal generated by the output clock signal, and generating the delay indication signal according to a digital value of the detection result.

2. The delay lock loop circuit according to claim 1, wherein the phase detecting circuit comprises:
   M flip-flops, wherein a data end of a first flip-flop receives the reference clock signal, a clock end of the first flip-flop receives the feedback clock signal, an inverted output end of Nth flip-flop is coupled to a data end of N+1 first flip-flop, wherein M is an integer larger than 1, and N is an integer larger than 0 and smaller than M.

3. The delay lock loop circuit according to claim 1, wherein each of the M flip-flops comprises:
   a first inverter, receiving the reference clock signal and generating a control signal;
   a second inverter, coupled to the first inverter in series, and generating an inverted control signal;
   a transmission gate, coupled between the data end and an output end of each of the M flip-flops, the transmission gate is controlled by the control signal and the inverted control signal;
   a first tri-state inverter, having an input end coupled to the inverted output end of each of the M flip-flops, and having an output end coupled to the output end of each of the M flip-flops, the first tri-state inverter is controlled by the control signal and the inverted control signal;
   a third inverter, having an output end coupled to the inverted output end of each of the M flip-flops, and having an input end coupled to the output end of each of the M flip-flops.

4. The delay lock loop circuit according to claim 3, wherein each of the M flip-flops further comprises:
   a second tri-state inverter, having an input end coupled to a reset end of each of the M flip-flops, and having an output end coupled to the output end of each of the M flip-flops, the second tri-state inverter is turned on according to a reset signal on the reset end of each of the M flip-flops.

5. The delay lock loop circuit according to claim 2, wherein when the phase detecting circuit detects a number of consecutive times that the digital value equals to a first number larger than a first threshold value, the phase detecting circuit generates the delay indication signal to decrease a delay amount of the delay line circuit.

6. The delay lock loop circuit according to claim 5, wherein when the phase detecting circuit detects a number of consecutive times that the digital value equals to a second number larger than a second threshold value, the phase detecting circuit generates the delay indication signal to increase the delay amount of the delay line circuit.

7. The delay lock loop circuit according to claim 6, wherein the first threshold value and the second threshold value are same or different.

8. The delay lock loop circuit according to claim 6, wherein when the phase detecting circuit detects the digital value alternatively changed between a third number and a fourth number consecutively, the delay lock loop circuit is in a locked status.

9. The delay lock loop circuit according to claim 8, wherein the phase detecting circuit further comprises:
   a first logic circuit, performing a first logic operation on the digital value and generating a first signal if the digital value equals to the third number or the fourth number;
   a shift register circuit, coupled to the first logic circuit, shifting the first signal according to the feedback clock signal to generate a plurality of shifting bits;
   a second logic circuit, coupled to the shift register circuit, performing a second logic operation on the shifting bits to generate a locked flag, wherein the locked flag is used to indicate the delay lock loop circuit is in the locked status.

10. The delay lock loop circuit according to claim 9, wherein the first logic circuit comprises:
    a first AND gate, receiving a plurality of bits of the detection result and generating a second signal;
    a second AND gate, receiving a plurality of bits of an inverted signal of the detection result and generating a third signal; and
    an OR gate, receiving the second signal and the third signal and generating the first signal.

11. The delay lock loop circuit according to claim 9, wherein the second logic circuit comprises:
    an AND gate, receiving the shifting bits and generating the locked flag.

12. The delay lock loop circuit according to claim 9, wherein a number of the registers of the shift register circuit is larger than 1.

13. The delay lock loop circuit according to claim 6, wherein the phase detecting circuit further comprises:
    a first logic circuit, performing a first logic operation on the digital value for determining whether the digital value equals to the first number or the second number to generate a first signal;
    a shift register circuit, coupled to the first logic circuit, shifting the first signal according to the feedback clock signal to generating a plurality of shifting bits;

a second logic circuit, couple to the shift register circuit, performing a second logic operation on the shifting bits to generate a far-away-locked flag.

14. The delay lock loop circuit according to claim 13, wherein a number of the registers of the shift register circuit is larger than 1.

15. The delay lock loop circuit according to claim 13, wherein the phase detecting circuit generates the delay indication signal according to the far-away-locked flag.

16. The delay lock loop circuit according to claim 1, further comprising:
    an off-chip driver, coupled to the clock signal generator, receiving the output clock signal and providing the feedback clock signal.

17. The delay lock loop circuit according to claim 1, wherein the clock signal generator comprises:
    an amplifier, generating a first clock signal according to the delayed cloak signal; and
    a clock tree, generating the output clock signal according to the first clock signal.

* * * * *